(12) United States Patent
Habu et al.

(10) Patent No.: US 10,905,012 B2
(45) Date of Patent: Jan. 26, 2021

(54) METHOD FOR PRODUCING WIRING BOARD, AND WIRING BOARD

(71) Applicant: USHIO DENKI KABUSHIKI KAISHA, Tokyo (JP)

(72) Inventors: Tomoyuki Habu, Tokyo (JP); Shinichi Endo, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 269 days.

(21) Appl. No.: 16/080,564

(22) PCT Filed: Feb. 27, 2017

(86) PCT No.: PCT/JP2017/007438
§ 371 (c)(1),
(2) Date: Aug. 28, 2018

(87) PCT Pub. No.: WO2017/150435
PCT Pub. Date: Sep. 8, 2017

(65) Prior Publication Data
US 2020/0113061 A1    Apr. 9, 2020

(30) Foreign Application Priority Data
Mar. 3, 2016   (JP) .................................. 2016-041522

(51) Int. Cl.
*H05K 3/00* (2006.01)
*H05K 3/28* (2006.01)
(Continued)

(52) U.S. Cl.
CPC ......... *H05K 3/0026* (2013.01); *H05K 3/0023* (2013.01); *H05K 3/28* (2013.01); *H05K 3/42* (2013.01); *H05K 3/46* (2013.01)

(58) Field of Classification Search
CPC ...... H05K 3/0023; H05K 3/0026; H05K 3/28; H05K 3/42; H05K 3/46
See application file for complete search history.

(56) References Cited

U.S. PATENT DOCUMENTS

2015/0351251 A1   12/2015   Hirose et al.
2018/0153044 A1    5/2018   Habu et al.

FOREIGN PATENT DOCUMENTS

CN        101808477 A     8/2010
JP       2002-344144 A   11/2002
(Continued)

OTHER PUBLICATIONS

An Office Action mailed by the China National Intellectual Property Administration dated May 20, 2019, which corresponds to Chinese Patent Application No. 201780014239.6 and is related to U.S. Appl. No. 16/080,564.
(Continued)

*Primary Examiner* — Carl J Arbes
(74) *Attorney, Agent, or Firm* — Studebaker & Brackett PC (57) ABSTRACT

Disclosed is a method of manufacturing a wiring board, which allows a desmearing process to be carried out appropriately without roughening a surface of an insulating layer. The method of manufacturing a wiring board includes a light irradiation step for irradiating a wiring board material with ultraviolet light in an atmosphere containing oxygen. The wiring board material has an insulating layer laminated on a conductive layer, a protective layer formed on the insulating layer, and a through hole (viahole) that penetrates the insulating layer and the protective layer. The method also includes a plating step for forming a plating layer, which is made from a conductive material, on the surface of the wiring board material from which the protective layer has
(Continued)

been removed. The surface of the wiring board material includes a bottom of the through hole.

9 Claims, 4 Drawing Sheets

(51) Int. Cl.
*H05K 3/42* (2006.01)
*H05K 3/46* (2006.01)

(56) References Cited

FOREIGN PATENT DOCUMENTS

| JP | 2004-055618 | A |   | 2/2004 |
|----|-------------|---|---|--------|
| JP | 2009246233  | A |   | 10/2009 |
| JP | 2010010639  | A |   | 1/2010 |
| JP | 2011-171528 | A | * | 9/2011 |
| JP | 2015-086267 | A | * | 5/2015 |
| JP | 2015119015  | A |   | 6/2015 |
| WO | 2014104154  | A1 |  | 7/2014 |
| WO | 2015/093216 | A1 |  | 6/2015 |
| WO | 2016/203682 | A1 | * | 3/2016 |
| WO | 2016203682  | A1 |  | 12/2016 |

OTHER PUBLICATIONS

An Office Action mailed by the China National Intellectual Property Administration dated Oct. 14, 2019, which corresponds to Chinese Patent Application No. 201780014239.6 and is related to U.S. Appl. No. 16/080,564. with English language translation.

An Office Action mailed by the Korean Patent Office dated Oct. 29, 2019, which corresponds to Korean Patent Application 10-2018-7028103 and is related to U.S. Appl. No. 16/080,564.

International Search Report issued in PCT/JP2017/007438; dated Apr. 4, 2017.

An Office Action mailed by the Japanese Patent Office dated Sep. 10, 2019, which corresponds to Japanese Patent Application No. 2016-041522 and is related to U.S. Appl. No. 16/080,564.

An Office Action mailed by the Japanese Patent Office dated Mar. 26, 2019, which corresponds to Japanese Patent Application No. 2016-041522 and is related to U.S. Appl. No. 16/080,564; with English translation.

* cited by examiner

METHOD FOR PRODUCING WIRING BOARD, AND WIRING BOARD

TECHNICAL FIELD

The present invention relates to a method of manufacturing a wiring board that has a lamination of an insulating layer and a conductive layer, and a wiring board made by such manufacturing method.

BACKGROUND ART

In recent years, a multi-layer wiring structure is studied in connection with a printed wiring board (printed circuit board). In the multi-layer wiring board, an insulating layer is formed between a plurality of conductive layers, and a fine through hole, which is called a viahole, is formed in the insulating layer to allow electrical conduction between the conductive layers. An inner wall of the viahole is coated with a conductive layer by plating or the like.

The viahole may be formed by laser beam machining. When the viahole is formed, a residue, which is called a smear, is produced at the bottom of the viahole. If the smear remains, the connection between the conductive layer and a plating layer is deteriorated, and this adversely affects the overall performances of the wiring board. A conventional approach to avoid this is a desmearing process that removes the smear by a plasma process or a liquid chemical process.

Patent Literature Document 1 (Japanese Patent Application Laid-Open Publication No. 2011-171528) teaches that particles, in which a hydroxyl group can be formed, are embedded in the surface of the insulating layer in order to effectively couple a coupling agent, which firmly joints the plating layer with the insulating layer, with the insulating layer. In this patent literature document, a protective layer is attached to the surface of the insulating layer to prevent removal of the particles embedded in the surface of the insulating layer. The viahole is then formed, with the protective layer being attached. The protective layer is removed after the desmearing process is performed with the liquid chemical (wet desmearing process) or the plasma (plasma desmearing process).

LISTING OF REFERENCES

Patent Literature Documents

Patent Literature Document 1: Japanese Patent Application Laid-Open Publication No. 2011-171528

SUMMARY OF THE INVENTION

Problems to be Solved by the Invention

In recent years, the semiconductor elements tend to have a smaller size, and there is a demand for a finer wiring board. However, if the surface of the insulating layer is rough, the wiring pattern formed on the surface of the insulating layer cannot be formed in a desired manner. In particular, a fine wiring pattern that has an L/S (lines/spacing) of 10/10 μm or less cannot be formed properly. As a result, a fine wiring board cannot be made.

In Patent Literature Document 1 (Japanese Patent Application Laid-Open Publication No. 2011-171528, the desmearing process is carried out, with the protective layer being attached to the surface of the insulating layer. However, it is not possible to appropriately suppress the roughening of the surface of the insulating layer because the wet desmearing process or the plasma desmearing process is employed as the desmearing process.

A small gap is left between the insulating layer and the protective layer. Thus, when the wet desmearing process is used, the liquid chemical may enter between the insulating layer and the protective layer, and create the undesired roughening on the surface of the insulating layer around the viahole. In some cases, the protective layer may peel from the surface of the insulating layer, and the entire surface of the insulating layer may be roughened. When the plasma desmearing process is used, the protective layer is exposed to the plasma and ends of the protective layer may float. Then, those portions of the insulating layer from which the protective layer floats may be etched and roughened by the plasma.

Accordingly, an object of the present invention is to appropriately carry out the desmearing process without roughening the surface of the insulating layer.

Solution to the Problems

To achieve the above-mentioned object, one aspect of the present invention provides a method of manufacturing a wiring board, which includes a light irradiation step for irradiating a wiring board material with ultraviolet light in an atmosphere containing oxygen. The wiring board material has an insulating layer laminated on a conductive layer, a protective layer formed on the insulating layer, and a through hole that penetrates the protective layer and the insulating layer. The method also includes a plating step for forming a plating layer on a surface of the wiring board material from which the protective layer has been removed. The surface of the wiring board material includes a bottom of the through hole, and the plating layer is made from a conductive material.

In this manner, because the desmearing process is carried out with the ultraviolet light, the protective layer does not float or peel off, and it is possible to remove the smear from the through hole (viahole) while appropriately protecting the surface of the insulating layer. Therefore, it is possible to suppress the roughening of the surface of the insulating layer, and manufacture a wiring board that can have a fine wiring pattern. Because the ultraviolet light is used in the desmearing process, it is also possible to appropriately carry out the desmearing process while maintaining the shape of the viahole. Thus, a fine wiring board that has a high density (highly integrated wiring board) can also be manufactured.

The method of manufacturing a wiring board may further include a removing step for removing the protective layer from the wiring board material after the light irradiation step. If the protective layer is attached during the light irradiation step, and the protective layer is removed after the light irradiation step, it is possible to reliably suppress the roughening of the surface of the insulating layer.

The method of manufacturing a wiring board may further include a penetration step for forming the through hole that penetrates the protective layer and the insulating layer by irradiating the wiring board material, which has the conductive layer, the insulating layer laminated on the conductive layer, and the protective layer formed on the insulating layer, with a laser beam. If the viahole is formed in the wiring board material with the protective layer being attached to the wiring board material, it is possible for the viahole to have a small diameter and a small taper angle. Thus, it is possible to carry out the desmearing process while maintaining the shape of the viahole that has a small diameter and a small taper angle by performing the light irradiation step after the penetration step.

Another aspect of the present invention provides a wiring board, which is manufactured by one of the above-described wiring board manufacturing methods. Thus, the wiring board can be a fine wiring board that has a high density (highly integrated circuit board).

Advantageous Effects of the Invention

The present invention allows a desmearing process to be carried out in an appropriate manner without roughening the surface of the insulating layer and maintaining the shape of the viahole. Thus, it is possible to manufacture a fine wiring board with high density (highly integrated wiring board).

These and other objects, aspects and advantages of the present invention will become apparent to a skilled person from the following description of the embodiments (detailed description) when the appended claims and drawings are read and understood.

DESCRIPTION OF EMBODIMENTS

Embodiments of the present invention will now be described with reference to the drawings.

FIG. 1A to FIG. 1D show, in combination, a method of manufacturing a wiring board according to an embodiment. In this embodiment, a wiring board to be manufactured is a multi-layer wiring board that has a lamination of a conductive layer (wiring layer) and an insulating layer on a core substrate. The core substrate is made from, for example, a glass epoxy resin. A material of the conductive layer (wiring layer) is, for example, copper, nickel, gold, or zinc.

The insulating layer is made from, for example, resin that contains a granular (particulate) filler, and the filler is made from an inorganic substance. Such resin is, for example, epoxy resin, bismaleimide-triazine resin, polyimide resin, or polyester resin. A material of the particulate filler is, for example, silica, alumina, mica, silicate, barium sulfate, magnesium hydroxide, or titanium oxide.

Figure 1A:
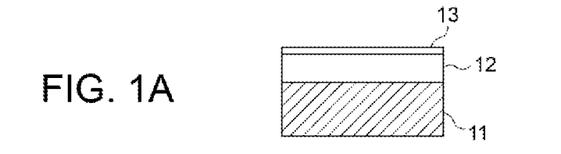
FIG. 1A illustrates a method of manufacturing a wiring board according to a first embodiment of the present invention.

When a multi-layer wiring board is manufactured, firstly, as shown in FIG. 1A, a wiring board material that has a lamination of a conductive layer 11 and an insulating layer 12 is prepared. A process of forming the insulating layer 12 on the conductive layer 11 may include applying an insulating layer material, which contains a particulate filler in liquid thermosetting resin, on the conductive layer, and curing the insulating layer material. Alternatively, the process of forming the insulating layer 12 on the conductive layer 11 may include joining an insulating sheet, which contains a particulate filler, onto the conductive layer by thermo-compression bonding or the like. On the surface of the insulating layer 12, formed is a protective layer 13 that is used to protect the insulating layer 12 when the insulating layer 12 is formed on the conductive layer 11. The protective layer 13 is made from, for example, a PET film.

Figure 1B:
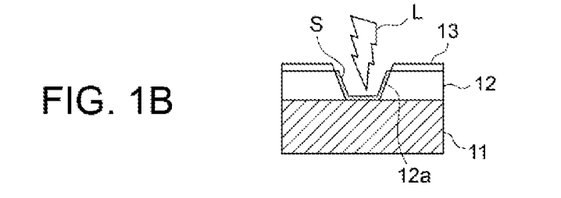
FIG. 1B illustrates the method of manufacturing the wiring board according to the first embodiment.

In a subsequent step, as shown in FIG. 1B, the insulating layer 12 is irradiated with a laser beam L that comes above the protective layer 13 to process (machine) the insulating layer 12 such that a viahole (through hole) 12a that has a depth reaching the conductive layer 11 is formed. A process for laser beam machining may use a $CO_2$ laser or a UV laser. As the viahole 12a is formed such that the viahole penetrates the insulating layer 12 with the protective layer 13, the resulting viahole 12a has a better shape than when the protective layer 13 were peeled from the insulating layer 12 and the viahole 12a were formed.

The viahole 12a having a better shape means that the inner wall (side wall) of the viahole 12a has a small taper angle and the shape of the viahole 12a is similar to a cylinder or a column. When the viahole 12a is prepared by the laser beam machining, the laser beam is converged (concentrated) to irradiate the wiring board material with the converged laser beam. If the viahole 12a is formed in the wiring board material with the protective layer 13 being disposed, as in this embodiment, it is possible extend the focal length (focal distance) by an amount equal to the thickness of the protective layer 13, as compared to a case where the viahole 12a were formed in the wiring board material from which the protective layer 13 were peeled (removed). Therefore, when the viahole 12a is formed in the wiring board material with the protective layer 13 being disposed, it is possible to obtain the viahole 12a having a better shape with a small taper angle.

As the viahole 12a is formed, smear (residue) S is produced, which is derived from the material of the insulating layer 12, on the side wall of the viahole 12a in the insulating layer 12, around the viahole 12 on the surface of the protective layer 13, and on the bottom of the viahole 12a, i.e., that portion of the conductive layer 11 which is exposed by the viahole 12a.

Figure 1C:
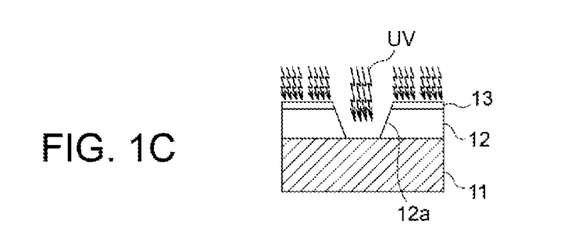
FIG. 1C illustrates the method of manufacturing the wiring board according to the first embodiment.

Therefore, a process of removing the smear S (desmearing process) is carried out, as shown in FIG. 1C. The desmearing process in this embodiment uses a so-called photo-desmearing step that irradiates a target area with ultraviolet light (UV) to remove the smear S. Specifically, the desmearing process includes a light irradiation step of irradiating the target area of the wiring board material with the ultraviolet light (photo-desmearing step), and a physical vibration step of applying physical vibrations to the wiring board material after the light irradiation step. In this embodiment, the desmearing process is carried out with the protective layer 13 being attached to the insulating layer 12.

The photo-desmearing step will be described in detail below.

The photo-desmearing step may be performed in the atmosphere such as a room air that contains oxygen. The ultraviolet light source to be used may be one of various lamps that can emit ultraviolet light (vacuum ultraviolet light) at a wavelength equal to or shorter than 220 nm, preferably equal to or shorter than 190 nm. For example, the ultraviolet light source is a xenon excimer lamp (peak wavelength is 172 nm), in which a xenon gas is contained in a sealed manner, or a low-pressure mercury lamp (185 nm emission line). In particular, the xenon excimer lamp may be preferably used as the ultraviolet light source used in the desmearing process. The wavelength is equal to or shorter than 220 nm in this embodiment because the ultraviolet light whose wavelength is greater than 220 nm is difficult to decompose and remove the smear derived from an organic substance such as resin.

In the photo-desmearing step, the smear derived from the organic substance is decomposed by ozone and/or active oxygen, which is produced when the smear is irradiated with the ultraviolet light whose wavelength is equal to or shorter than 220 nm, i.e., when the smear is subjected to the energy of the ultraviolet light and irradiated with the ultraviolet light. Smear derived from an inorganic substance, such as silica and alumina, becomes fragile when the smear is irradiated with the ultraviolet light. It should be noted that the irradiance (illuminance) of the ultraviolet light, the irradiation time of the ultraviolet light and other factors may appropriately be decided as the state of the remaining smear S and other conditions are taken into account.

Subsequently, the physical vibration step (not shown), which applies the physical vibrations to the wiring board material, is carried out to remove the smear S that is left after the photo-desmearing step (light irradiation step). The physical vibration step may be performed by a step of applying ultrasonic vibrations. Preferably, the frequency of the ultrasonic wave in the ultrasonic vibration step is, for example, between 20 kHz, inclusive, and 70 kHz, inclusive. This is because it becomes difficult to destroy the smear derived from the inorganic substance and remove the smear from the wiring board material if the frequency of the ultrasonic wave is greater than 70 kHz.

A vibration medium of the ultrasonic wave used in such ultrasonic vibration step may be liquid such as water, or a gas such as air.

Specifically, when the water or the like is used as the vibration medium, the wiring board material is immersed in the water, and the water is ultrasonically vibrated to carry out the ultrasonic vibration step. When the liquid is used as the vibration medium of the ultrasonic wave, the time of the ultrasonic vibration step is, for example, between 10 seconds, inclusive, and 600 seconds, inclusive.

When the air is used as the vibration medium, the compressed air is sprayed or injected to the wiring board material while the compressed air is ultrasonically vibrated, thereby carrying out the ultrasonic vibration step. In this step, it is preferred that the pressure of the compressed air is, for example, equal to or greater than 0.2 MPa. The time of the ultrasonic vibration step with the compressed air is, for example, between 5 seconds, inclusive, and 60 seconds, inclusive.

Although the photo-desmearing step and the physical vibration step may be carried out once, respectively, in the above-mentioned order, it is preferred that the photo-desmearing step and the physical vibration step are carried out repeatedly in an alternating manner. The number of repeating the photo-desmearing step and the physical vibration step may appropriately be decided depending upon the irradiation time of the ultraviolet light in each of the photo-desmearing steps and other conditions. For example, the number of repeating the photo-desmearing step and the physical vibration step is between one, inclusive, and five, inclusive.

As the treatment gas that contains oxygen is irradiated with the ultraviolet light in the photo-desmearing step, as described above, the ozone and/or the active oxygen is generated, and the smear S derived from the organic substance is decomposed and gasified by the ozone and/or the active oxygen. As a result, most of the smear S derived from the organic substance is removed. In the meantime, the smear S derived from the inorganic substance is exposed upon removal of the smear S derived from the organic substance. As the smear is further irradiated with the ultraviolet light, the smear becomes fragile. By applying the physical vibration step to the smear S in this condition, the exposed smear S derived from the inorganic substance and the remaining smear S derived from the organic substance are destroyed and removed by the mechanical actions due to the vibrations. Alternatively, or in addition to this, small gaps are created in or between the respective smear by shrinkage of the smear S derived from the inorganic substance and by the difference in the thermal expansion generated upon irradiating the respective smear S with the ultraviolet light. Thus, the smear S derived from the inorganic substance is removed from the wiring board material upon applying the physical vibration step. As a result, the smear S derived from the inorganic substance and the smear S derived from the organic substance are completely removed from the wiring board material.

The desmearing process of this embodiment simply includes applying the light irradiation step to the wiring board material and the physical vibration step to the wiring board material. Thus, the desmearing process does not use a chemical or chemicals, which would require a process of treating the waste liquid.

Figure 1D:
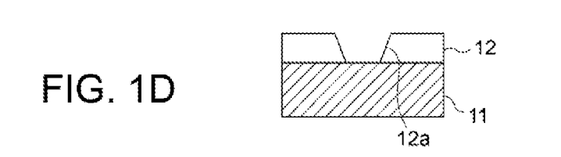
FIG. 1D illustrates the method of manufacturing the wiring board according to the first embodiment.

As the photo-desmearing step is completed, the protective layer 13 is removed from the upper surface of the insulating layer 12, as shown in FIG. 1D.

Figure 2A:
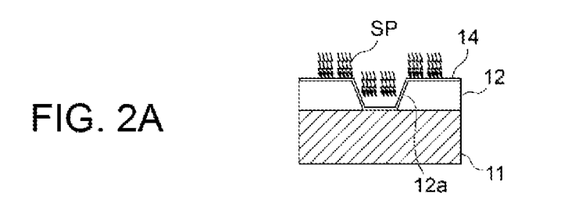
FIG. 2A illustrates the method of manufacturing the wiring board after a desmearing process is performed.
Figure 2B:
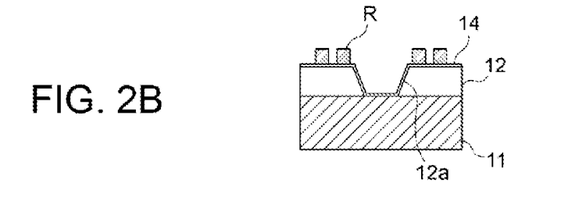
FIG. 2B illustrates the method of manufacturing the wiring board after the desmearing process is performed.

After the protective layer 13 is removed, a seed layer 14 of about 50 nm that serves as an undercoating for the plating is formed on the upper surface of the insulating layer 12 and the inner surface of the viahole 12a, as shown in FIG. 2A. Sputtering (SP) with Ti (titanium) may be used as a process of forming the seed layer 14. Subsequently, as shown in FIG. 2B, a resist pattern R is formed on the seed layer 14. An exemplary process of forming the resist pattern R may include applying a resist on the seed layer 14 and then performing an exposure process and a development process to form a desired pattern.

Figure 2C:
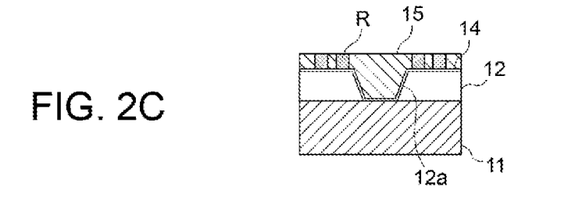
FIG. 2C illustrates the method of manufacturing the wiring board after the desmearing process is performed.
Figure 2D:
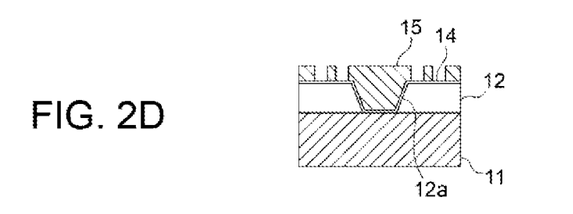
FIG. 2D illustrates the method of manufacturing the wiring board after the desmearing process is performed.
Figure 2E:
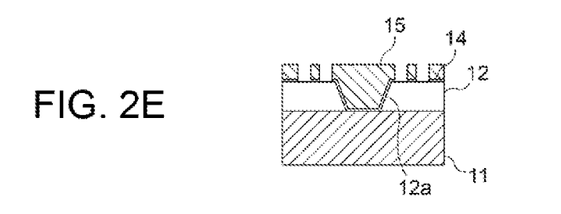
FIG. 2E illustrates the method of manufacturing the wiring board after the desmearing process is performed.

Subsequently, as shown in FIG. 2C, a plating layer 15 is formed on the seed layer 14 such that the plating layer is present in the viahole 12a and the openings of the resist pattern R by, for example, electroplating. The plating layer 15 may be a layer made from Cu (copper) or the like having a size of about 20 µm to about 50 µm. The plating layer 15, which is formed in this manner, will serve as the wiring layer in the upper tier of the conductive layer 11, and is connected to the conductive layer 11 at the bottom of the viahole 12a. Subsequently, the resist pattern R is removed, as shown in FIG. 2D, and the seed layer 14 is removed with the plating layer 15 being used as a mask by flash etching, as shown in FIG. 2E. Then, an insulating layer (not shown) is laminated on the plating layer 15.

Among the steps shown in FIG. 1A to FIG. 1D, the step shown in FIG. 1B corresponds to a penetration step of forming a through hole, and the step shown in FIG. 1C corresponds to a light irradiation step of irradiating a target with the ultraviolet light in an atmosphere (room air) containing oxygen. The step shown in FIG. 2C corresponds to a plating step of forming a plating layer, which is made from a conductive material.

In this embodiment, as described above, the insulating layer 12 is laminated on the conductive layer 11, the protective layer 13 is formed on the insulating layer 12, the through hole (viahole) 12a penetrates the protective layer 13 and the insulating layer 12, and the photo-desmearing step is applied to the wiring board material that includes the conductive layer 11, the insulating layer 12, the protective layer 13 and the through hole 12a. Thus, the wiring board material is irradiated with the ultraviolet light, with the protective layer 13 being used as the mask, to apply the desmearing process to the interior of the viahole 12a. After the smear S is removed by the photo-desmearing step, the protective layer 13 is removed from the insulating layer 12, and the plating layer 15 is formed.

Accordingly, the protective layer 13 protects the surface of the insulating layer 12 during the photo-desmearing step, and it is possible to suppress the roughening of the surface of the insulating layer 12. Because the photo-desmearing step with the ultraviolet light is employed as the desmearing process, it is possible to appropriately remove the smear while maintaining the shape of the viahole 12a.

Conventionally, the desmearing process is carried out with a liquid chemical such as potassium permanganate solution (wet desmearing process) or with plasma (plasma desmearing process). However, such conventional desmearing processes cannot maintain the shape of the viahole when removing the smear.

Figure 3A:
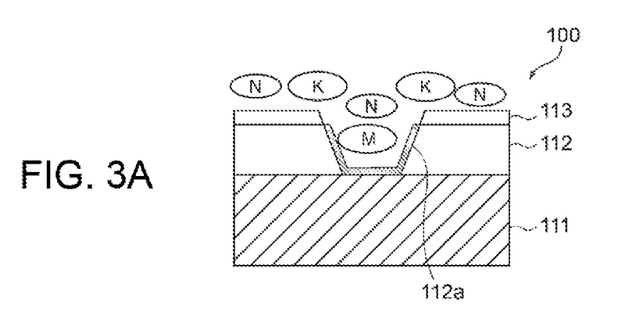
FIG. 3A is a view useful to describe problems of a wet desmearing process.
Figure 3B:
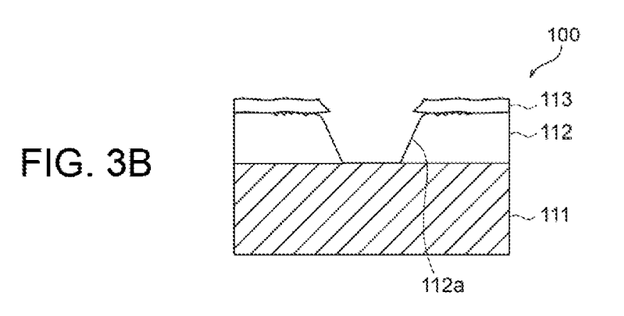
FIG. 3B is a view useful to describe the problems of the wet desmearing process.
Figure 3C:
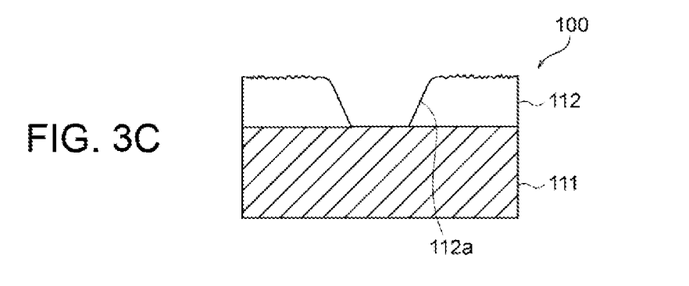
FIG. 3C is a view useful to describe the problems of the wet desmearing process.
Figure 4A:
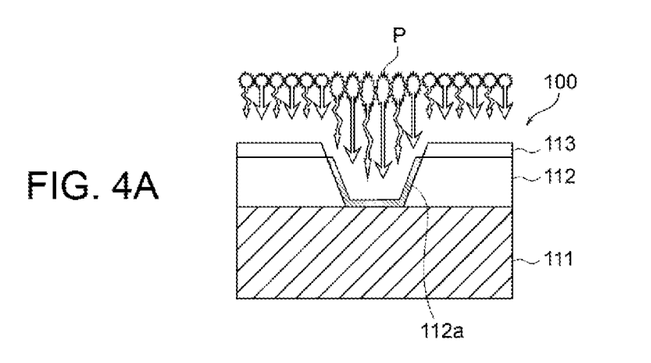
FIG. 4A is a view useful to describe problems of a plasma desmearing process.
Figure 4B:
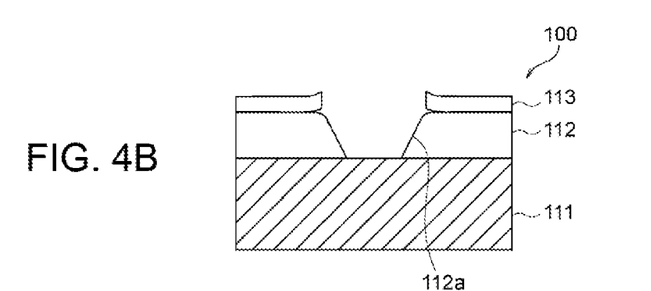
FIG. 4B is a view useful to describe the problems of the plasma desmearing process.

FIG. 3A to FIG. 3C are views useful to describe the wet desmearing process, and FIG. 4A and FIG. 4B are views useful to describe the plasma desmearing process. In the illustrated examples, the insulating layer 112 is laminated on the conductive layer 111, the protective layer 113 is formed on the insulating layer 112, the viahole 112a penetrates the protective layer 113 and the insulating layer 112, and the respective desmearing processes are applied to the wiring board material 100 that includes the conductive layer 111, the insulating layer 112, the protective layer 113 and the viahole 112a.

As shown in FIG. 3A, when the wiring board material 100 is immersed in the liquid chemical such as potassium permanganate solution, the interior of the viahole 112a is roughened by the liquid chemical, and the shape of the viahole 112a changes, i.e., the viahole loses its shape. In addition, when the wet desmearing process is used, the solution enters small gaps formed between the insulating layer 112 and the protective layer 113, as shown in FIG. 3B. Thus, the surface of the insulating layer 112 is roughened around or in the vicinity of the viahole 112a. In some instances, the protective layer 113 peels from the insulating layer 112, the wet desmearing process is applied with the protective layer 113 being removed from the insulating layer 112. As a result, the entire surface of the insulating layer 112 may be roughened, as shown in FIG. 3C.

As illustrated in FIG. 4A, when the wiring board material 100 is subjected (exposed) to the plasma P, the protective layer 113 is subjected to the plasma P. As a result, ends of the protective layer 113 float or bend upward, as shown in FIG. 4B. Then, those portions of the insulating layer 112 from which the protective layer 113 floats are etched by the plasma P, and the shape of the viahole 112a changes.

In the embodiment, on the contrary, the photo-desmearing step is employed as the desmearing process. Thus, the inner wall of the viahole is not eroded, and the peripheral area of the opening of the viahole is not eroded. The shape of the viahole is, therefore, maintained. Also, when the photo-desmearing step is used, the protective layer 13 does not float and does not peel. Thus, it is possible to appropriately attach the protective layer 13 on the insulating layer 12 until the photo-desmearing step is completed. Consequently, it is possible to reliably suppress the roughening of the surface of the insulating layer 12.

In recent years, there is a tendency that the semiconductor elements and devices are manufactured in a smaller size, and there is a demand for finer wiring board. However, if the surface of the insulating layer is rough, a fine wiring pattern that has an L/S (lines/spacing) of, for example, 10/10 μm or less cannot be formed properly on the insulating layer. As a result, a fine wiring board cannot be made. The embodiment of the invention, on the other hand, can suppress the roughening of the surface of the insulating layer 12 and keep the smoothness of the surface of the insulating layer 12, as described above. Thus, it is possible to form the wiring pattern on the smooth surface of the insulating layer 12. Accordingly, it is possible to provide a fine wiring pattern on the insulating layer 12 in a desired manner and properly manufacture the fine wiring board.

Because there is a demand for the wiring board that has a much higher density (highly integrated wiring board), the wiring pattern is desired to have a finer pattern and the viahole is also desired to have a smaller diameter. In particular, there is a demand for the viahole having a smaller taper, i.e., there is a demand that the viahole has a shape close to a cylindrical column. In this embodiment, the insulating layer 12 is laminated on the conductive layer 11, the protective layer 13 is formed on the insulating layer 12, and the wiring board material having the conductive layer, the insulating layer and the protective layer is irradiated with the laser beam to form the through hole (viahole) 12a that penetrates the protective layer 13 and the insulating layer 12. Thus, the viahole 12a is formed by the laser beam machining with the protective layer 13, and therefore it is possible for the viahole to have a small diameter and a small taper (small tapered side wall).

The wet desmearing process uses the liquid chemical such as potassium permanganate solution. Thus, if the wet desmearing process is applied to a viahole having a small diameter, the liquid chemical is difficult to flow (penetrate) into the viahole, and there is a possibility that the smear is not removed properly. The plasma desmearing process uses the plasma that has high directivity. Thus, if the plasma desmearing process is applied to a viahole having a small tapered side wall, it is difficult to remove the smear from the side wall.

The embodiment of the invention, on the contrary, employs the photo-desmearing process that irradiates the target (smear) with the ultraviolet beam in a treatment gas, i.e., an atmosphere containing oxygen. In the photo-desmearing process, active species such as ozone and oxygen radical are generated, and caused to enter the viahole. Accordingly, even if the viahole has a small diameter and a small tapered side wall, it is possible to properly remove the smear while maintaining the shape of the viahole. Therefore, it is possible to manufacture a fine wiring board having a high reliability and a high density (high degree of integration).

It should be noted that although the physical vibration process is carried out after the photo-desmearing process in the above-described embodiment, the physical vibration process is not indispensable. For example, if the insulating layer does not contain the filler or in a similar case, the physical vibration process may be omitted.

It should also be noted that the process of making the viahole 12a is not limited to the laser beam machining. For example, drilling may be employed. The process of making the viahole 12a may appropriately be selected on the basis of the diameter of the opening of the viahole 12a and other factors.

EXAMPLES

Now, practical examples or experiments, which were performed to confirm advantageous effects of the invention, will be described.
<Wiring Board Material>

Firstly, a core material was prepared from a prepreg that was made from glass epoxy resin and copper, and epoxy resin of 25 µm was laminated on both faces of the core material in a vacuum. Then, the core material underwent high-pressure pressing and baking to prepare a laminated body. A protective layer, which was made from a PET film, was disposed on the surface of the laminated body, and the laminated body underwent laser beam machining with a viahole machining device ($CO_2$ laser or UV laser) such that blind viaholes were made at 500 µm intervals (pitch) in a lattice (grid) form. The diameter of the opening of each viahole was 50 µm. The wiring board material was obtained in this manner.

Example of the Invention (Embodiment)

A photo-desmearing process was applied to the above-described wiring board material, with the protective layer (PET) being attached thereto, by using the ultraviolet light of 172 nm wavelength.

Comparative Example 1

After the protective layer (PET) was removed from the above-described wiring board material, the photo-desmearing process was applied to the wiring board material by using the ultraviolet light of 172 nm wavelength.

Comparative Example 2

A plasma desmearing process was applied to the above-described wiring board material, with the protective layer (PET) being attached thereto, by using plasma.

Comparative Example 3

A wet desmearing process was applied to the above-described wiring board material, with the protective layer (PET) being attached thereto, by using permanganic acid solution.

In the example of the invention (embodiment) and the comparative examples 1-3, the diameter $D_{top}$ of the opening of the viahole (Diameter±3σ) (µm), the diameter $D_{btm}$ at the bottom of the viahole (Diameter±3σ) (µm), and the surface roughness Ra (nm) around the viahole of the board were measured, respectively, before and after the desmearing process. The results are shown in Table 1. In this table, the surface roughness Ra around the viahole is an arithmetic mean estimation (arithmetic average value), which was measured in accordance with JIS B0601. In Table 1, the diameter of the opening of the viahole before the desmearing process (Before) is denoted by $D_{top}B$, the diameter at the bottom of the viahole before the desmearing process (Before) is denoted by $D_{btm}B$, the diameter of the opening of the viahole after the desmearing process (After) is denoted by $D_{top}A$, and the diameter at the bottom of the viahole after the desmearing process (After) is denoted by $D_{btm}A$. In Table 1, the change in the viahole opening diameter $D_{top}$ before and after the desmearing process is denoted by a diameter ratio (after desmearing/before desmearing), and the change in the viahole bottom diameter $D_{btm}$ before and after the desmearing process is denoted by a diameter ratio (after desmearing/before desmearing).

In the example of the invention (embodiment) and the comparative examples 1-3, the taper angle TA (°) of the viahole was measured before and after the desmearing process, and the ratio of the taper angles before and after the desmearing process was also measured. The results are shown in Table 2. In this table, the taper angle TA is a value calculated in accordance with JIS B0612. In Table 2, the taper angle of the viahole before the desmearing process (Before) is denoted by TAB, the taper angle of the viahole after the desmearing process (After) is denoted by TAA, and the ratio of these two angles is denoted by TAA/TAB.

TABLE 1

| | | | Before Desmearing | | | After Desmearing | | | Diameter Ratio (After desmearing/Before desmearing) | |
|---|---|---|---|---|---|---|---|---|---|---|
| | Desmearing | PET | $D_{top}B$ (µm) | $D_{btm}B$ (µm) | Ra (nm) | $D_{top}A$ (nm) | $D_{btm}A$ (µm) | Ra (nm) | $D_{top}A/D_{top}B$ | $D_{btm}A/D_{btm}B$ |
| Embodiment | Photo | attached | 50.0 ± 2.1 | 43.2 ± 2.3 | 53 | 54.3 ± 3.7 | 46.0 ± 2.1 | 53 | 1.09 | 1.07 |
| Comparative Example 1 | Photo | removed | 50.0 ± 2.1 | 43.2 ± 2.3 | 53 | 54.3 ± 3.7 | 46.0 ± 2.1 | 139 | 1.09 | 1.07 |
| Comparative Example 2 | Plasma | attached | 50.0 ± 2.1 | 43.1 ± 2.2 | 49 | 65.3 ± 2.1 | 50.0 ± 1.9 | 393 | 1.31 | 1.16 |
| Comparative Example 3 | Wet | attached | 50.0 ± 2.0 | 43.1 ± 2.3 | 48 | 70.3 ± 2.5 | 52.2 ± 2.2 | 423 | 1.41 | 1.21 |

TABLE 2

| | Before desmearing Taper Angle TAB (°) | After desmearing Taper Angle TAA (°) | After desmearing/Before desmearing TAA/TAB |
|---|---|---|---|
| Embodiment | 15.5 | 18.9 | 1.22 |
| Comparative Example 1 | 15.5 | 18.9 | 1.22 |
| Comparative Example 2 | 15.6 | 34.0 | 2.17 |
| Comparative Example 3 | 15.6 | 39.9 | 2.55 |

As shown in Table 1, the viahole diameter and the surface roughness before the desmearing process are almost the same in all of the results.

It is understood from the Diameter Ratio in Table 1 that the diameter at the viahole opening and the diameter at the viahole bottom expanded after the desmearing process when each of the photo-desmearing processes of the embodiment (present invention) and the comparative example 1 was applied, but the amounts of expansion were small, respectively. The viahole opening diameter $D_{top}$ and the viahole bottom diameter $D_{btm}$ expanded in a similar rate. It is understood from Table 2 that the value of TAA/TAB, which represents the change from the taper angle TAB of the viahole before the desmearing process to the taper angle TAA of the viahole after the desmearing process, is also small, and therefore it can be said that the viahole shape expands to a similar shape. In other words, we can conclude that the viahole shape is maintained in a desired manner.

When the plasma desmearing process of the comparative example 2 was applied, the viahole opening diameter and the viahole bottom diameter expanded significantly after the desmearing process. Also, it is understood from the Diameter Ratio in Table 1 that the expanding ratio of the viahole opening diameter $D_{top}$ is greater than the expanding ratio of the viahole bottom diameter $D_{btm}$. The value of TAA/TAB in Table 2 is also large. Thus, it is observed that the taper angle of the viahole became greater after the desmearing process. In other words, the shape of the viahole is not maintained.

When the wet desmearing process of the comparative example 3 was applied, the diameter of the viahole after the desmearing process expanded most in the comparative example 3 among all the results (the invention (embodiment) and the comparative examples 1-3), and the taper angle of the viahole became large in the comparative example 3. In other words, the shape of the viahole is not maintained.

With regard to the surface roughness around the viahole of the board after the desmearing process, the protective layer did not peel off during the desmearing process of the embodiment, and it was possible to carry out the desmearing process while protecting the surface of the board with the protective layer. Thus, the surface roughness around the viahole was maintained when the desmearing process of the embodiment was applied.

When the photo-desmearing process of the comparative example 1 was applied, the surface of the insulating layer was not protected by the protective layer, and therefore the surface of the insulating layer was roughened to a certain extent. However, the roughening of the surface was small, and it can be said that it is moderate roughening. In contrast, when the plasma desmearing process of the comparative example 2 was applied, and the wet desmearing process of the comparative example 3 was applied, the roughening of the surface around the viahole was significantly large as compared to the photo-desmearing process. In other words, when the plasma desmearing process and the wet desmearing process were applied, the protective layer floated around the periphery of the viahole during the desmearing process or the protective layer completely peeled off, even if the desmearing process was carried out with the protective layer being attached to the surface of the insulating layer. Thus, not only the periphery of the viahole but also the entire surface of the board may significantly be roughened.

As such, it was confirmed that the photo-desmearing process of the embodiment of the invention did not cause the protective layer to peel off and certainly suppressed the roughening of the surface of the insulating layer. It was also confirmed that the photo-desmearing process could suppress the roughening of the surface of the board even when the surface of the board was not protected by the protective layer, as compared to the wet desmearing process and the plasma desmearing process. In other words, it was confirmed that the photo-desmearing process of the embodiment of the invention suppressed the roughening in the viahole even when the viahole was not protected by the protective layer and the photo-desmearing process of the embodiment maintained the shape of the viahole.

As described above, it is possible to make the viahole diameter small and the viahole taper small if the wiring board material, which has the insulating layer laminated on the conductive layer and the protective layer formed on the insulating layer, is irradiated with the laser beam to form the viahole that penetrates the protective layer and the insulating layer. Because the photo-desmearing process that irradiates the wiring board material, which has the viahole formed therein, with the ultraviolet light is carried out in the atmosphere containing oxygen, it is possible to appropriately carry out the desmearing process while maintaining the shape of the viahole, which has the small diameter and the small taper angle, and maintaining the surface roughness. Therefore, it is possible to provide a fine wiring board with a high density (highly integrated wiring board).

It should be noted that although a particular embodiment has been described in the foregoing, this embodiment is a mere example, and does not intend to limit the scope of the present invention. The apparatus and the method described in this specification may be embodied in different modes and embodiments than the above-described embodiment. It is also possible to make omissions, substitutions, changes and modifications to the above-described embodiment under given conditions, without departing from the spirit and scope of the present invention. Embodiments that include such omissions, substitutions, changes and modifications are encompassed by the claims and their equivalents, and fall within the technical scope of the present invention.

REFERENCE NUMERALS AND SYMBOLS

11: Conductive layer
12: Insulating layer
12a: Viahole
13: Protective layer
14: Seed layer
15: Plating layer
L: Laser
R: Resist pattern
S: Smear

The invention claimed is:
1. A method of manufacturing a wiring board comprising:
a light irradiation step for irradiating a wiring board material with ultraviolet light in an atmosphere con- taining oxygen in order to remove a smear from a through hole of the wiring board material while protecting a surface of an insulating layer of the wiring board material with a protective layer, the wiring board material having the insulating layer laminated on a conductive layer, and the protective layer formed on the insulating layer, the protective layer being made from a PET film, and the through hole being formed such that the through hole penetrates the protective layer and the insulating layer; and a plating step for forming a plating layer on a surface of the wiring board material from which the protective layer has been removed, said surface of the wiring board material including a bottom of the through hole, the plating layer being made from a conductive material.

2. The method of manufacturing a wiring board according to claim 1 further comprising a removing step for removing the protective layer from the wiring board material after the light irradiation step and before the plating step.

3. The method of manufacturing a wiring board according to claim 1 further comprising a penetration step for forming the through hole that penetrates the protective layer and the insulating layer by irradiating the wiring board material, which has the insulating layer laminated on the conductive layer, and the protective layer formed on the insulating layer, with a laser beam.

4. A wiring board manufactured by the method of manufacturing a wiring board according to claim 1.

5. The method of manufacturing a wiring board according to claim 2 further comprising a penetration step for forming the through hole that penetrates the protective layer and the insulating layer by irradiating the wiring board material, which has the insulating layer laminated on the conductive layer, and the protective layer formed on the insulating layer, with a laser beam.

6. The method of manufacturing a wiring board according to claim 1, wherein the ultraviolet light in the light irradiation step is vacuum ultraviolet light.

7. A method of manufacturing a wiring board comprising:
a preparation step for preparing a wiring board material that includes a conductive layer, an insulating layer laminated on the conductive layer, and a protective layer formed on the insulating layer, the protective layer being made from a PET film;

a first light irradiation step for irradiating the wiring board material with a laser beam in order to form a through hole that penetrates the protective layer and the insulating layer;

a second light irradiation step for irradiating the wiring board material with ultraviolet light in an atmosphere containing oxygen in order to remove a smear from the through hole while using the protective layer to protect a surface of the insulating layer, the second light irradiation step being carried out after the first light irradiation step;

a removing step for removing the protective layer from the wiring board material after the second light irradiation step; and a plating step for forming a plating layer on a surface of the wiring board material after the removing step, said surface of the wiring board material including a bottom of the through hole, the plating layer being made from a conductive material.

8. The method of manufacturing a wiring board according to claim 7 further including a shaking step of physically shaking the wiring board material between the second light irradiation step and the removing step.

9. The method of manufacturing a wiring board according to claim 8, wherein the ultraviolet light in the second light irradiation step is vacuum ultraviolet light.

* * * * *